(12) United States Patent
Mo et al.

(10) Patent No.: US 11,236,425 B2
(45) Date of Patent: Feb. 1, 2022

(54) METHOD OF PROCESSING SUBSTRATE

(71) Applicant: TOKYO ELECTRON LIMITED, Tokyo (JP)

(72) Inventors: Kennan Mo, Nirasaki (JP); Nuri Choi, Nirasaki (JP); Kouichi Sekido, Nirasaki (JP); Katsumasa Yamaguchi, Nirasaki (JP); Eiichi Komori, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 138 days.

(21) Appl. No.: 16/217,656

(22) Filed: Dec. 12, 2018

(65) Prior Publication Data

US 2019/0177849 A1  Jun. 13, 2019

(30) Foreign Application Priority Data

Dec. 13, 2017  (JP) .............................. JP2017-239005

(51) Int. Cl.
*C23C 16/52* (2006.01)
*H01L 21/285* (2006.01)
(Continued)

(52) U.S. Cl.
CPC ........ *C23C 16/52* (2013.01); *C23C 16/45525* (2013.01); *G05D 11/00* (2013.01); *H01L 21/28506* (2013.01); *H01L 22/20* (2013.01)

(58) Field of Classification Search
CPC .......................... C23C 16/52; C23C 16/45525
See application file for complete search history.

(56) References Cited

U.S. PATENT DOCUMENTS 4,436,674 A * 3/1984 McMenamin ........... B01J 4/008
                                                          118/692
4,671,097 A * 6/1987 Kurki ................... G05D 7/0641
                                                          702/100
(Continued)

FOREIGN PATENT DOCUMENTS

JP          2017-66511 A      4/2017

OTHER PUBLICATIONS

Nedeltchev, Stoyan, et al., "A New Correction Factor for Theoretical Prediction of Mass Transfer Coefficients in Bubble Columns". Journal of Chemical Engineering of Japan, vol. 39, No. 12, pp. 1237-1242, 2006.*

(Continued)

*Primary Examiner* — Bret P Chen
(74) *Attorney, Agent, or Firm* — Nath, Goldberg & Meyer; Jerald L. Meyer; Tanya E. Harkins

(57) ABSTRACT

A method of processing each of a plurality of substrates comprises: obtaining a first correction factor based on a first flow rate set value of a mass flow controller and a first measurement value of a mass flow meter; adjusting the first flow rate set value of the mass flow controller with the first correction factor so that the flow rate of the vaporized raw material becomes equal to a target value to process the substrate; obtaining a second correction factor based on a second flow rate set value of the mass flow controller and a second measurement value of the mass flow meter; and adjusting the second flow rate set value of the mass flow controller with the second correction factor so that the flow rate of the vaporized raw material becomes equal to the target value to process the substrate.

9 Claims, 9 Drawing Sheets

(51) Int. Cl.
  *H01L 21/66*   (2006.01)
  *C23C 16/455*  (2006.01)
  *G05D 11/00*   (2006.01)

(56) References Cited

U.S. PATENT DOCUMENTS

| | | | | |
|---|---|---|---|---|
| 4,688,418 | A * | 8/1987 | Cheung | G01F 15/08 374/100 |
| 4,747,596 | A * | 5/1988 | Harrison | A63B 71/06 108/23 |
| 4,947,889 | A * | 8/1990 | Ishikawa | G01F 1/688 137/486 |
| 5,199,306 | A * | 4/1993 | Hunter | G01F 1/363 73/215 |
| 5,419,924 | A * | 5/1995 | Nagashima | C23C 16/4481 118/726 |
| 5,520,969 | A * | 5/1996 | Nishizato | C23C 16/4481 427/248.1 |
| 5,645,642 | A * | 7/1997 | Nishizato | C23C 16/4481 118/692 |
| 5,993,916 | A * | 11/1999 | Zhao | C23C 16/4411 117/104 |
| 6,136,725 | A * | 10/2000 | Loan | C23C 16/4485 438/758 |
| 6,139,640 | A * | 10/2000 | Ramos | C23C 16/4412 118/715 |
| 9,234,775 | B2 * | 1/2016 | Larson | G05D 7/0652 |
| 2004/0206189 | A1 * | 10/2004 | Henry | G01F 1/74 73/861.356 |
| 2004/0250600 | A1 * | 12/2004 | Bevers | G01F 25/0038 73/1.16 |
| 2005/0249874 | A1 * | 11/2005 | Hoshino | C23C 16/52 427/248.1 |
| 2007/0254093 | A1 * | 11/2007 | Nijhawan | C23C 16/4482 427/8 |
| 2009/0266139 | A1 * | 10/2009 | Gregor | G01F 25/0038 73/1.16 |
| 2011/0281763 | A1 * | 11/2011 | Zhou | G01N 30/467 506/11 |
| 2016/0319726 | A1 * | 11/2016 | Otsuki | G01N 1/2252 |

OTHER PUBLICATIONS

Unnikrishnan, P.N, et al., "Conversion factors for Thermal Mass flow meters for different operating mediums: An Experimental study". flotek.g 2017—"Innovative Solutions in Flow Measurement and Control—Oil, Water and Gas" Aug. 28-30, 2017, FCRI, Palakkad, Kerala, India.*

Smit, Maarten, Jan, "Thermal control and rate of deposition system of chemical vapor deposition at atmospheric pressure". Report CTI Renato Archer—Divisão de Mostradores de Informação University of Twente—Faculty of Engineering Technology—Applied Mechanics Aug. 7, 2012, pp. 1-41.*

Boer, H.J., "Mass Flow Controlled Evaporation System". Journal De Physique TV Colloque C5, supplkmentau Journal de Physique 11, vol. 5, Jun. 1995, C5-961 to C5-966.*

Lotters, Ir J.C., et al., "Digital mass flow control". III-Vs Review, vol. 17, Issue 9, Dec. 2004-Jan. 2005, p. 21.*

Tison, S.A., "A critical evaluation of thermal mass flow meters". Journal of Vacuum Science & Technology A 14(4), Jul./Aug. 1996, 2582-2591.*

Gazicki, Maciej, et al., "Precise measurement of flow rates of vaporized tetraethylgermanium carried by an inert gas". Journal of Vacuum Science & Technology, vol. 10, Issue 1, 51 (1992) 2 pages. Abstract Only.*

Alvesteffer, William J., et al., "A Brief History of the Thermal Mass Flow Meter and Controller". Chapter 18 from 50 Years of Vacuum Coating Technology and the Growth of the Society of Vacuum Coaters, Donald M. Mattox and Vivienne Harwood Mattox, eds. 2010 Summer Bulletin, pp. 42.45.*

* cited by examiner

FIG. 6A
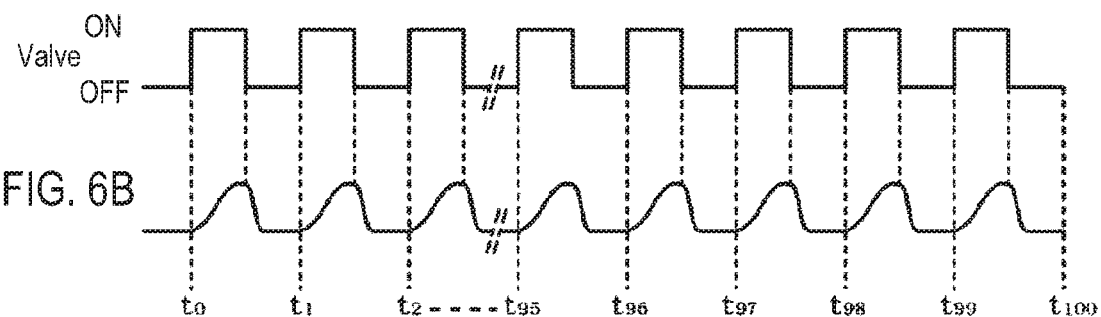
FIG. 6B
FIG. 7
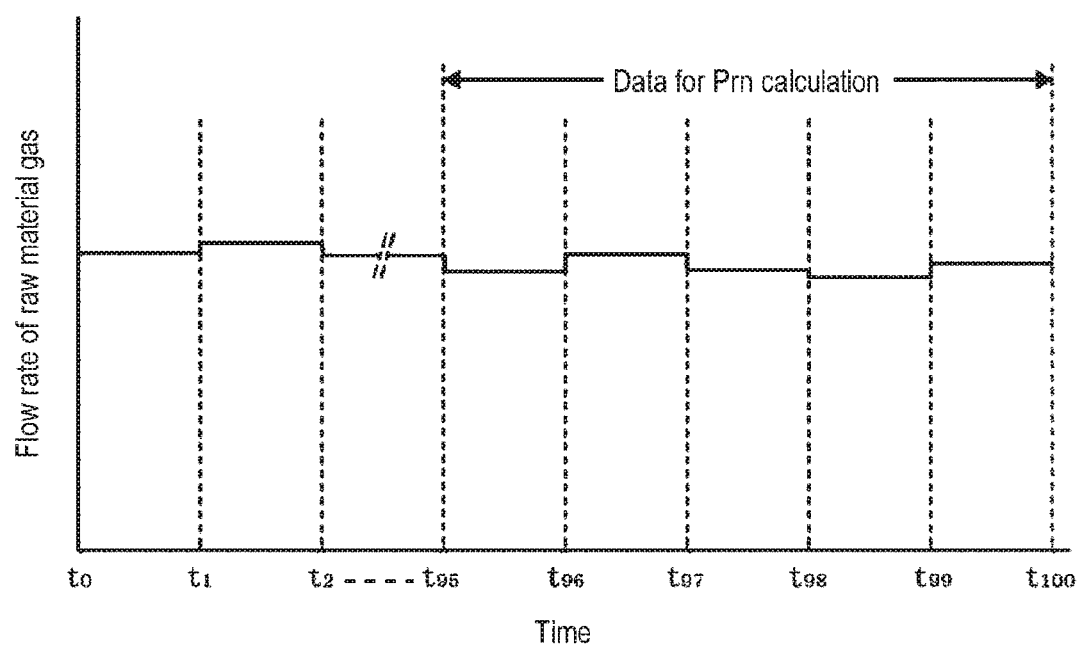

METHOD OF PROCESSING SUBSTRATE

CROSS-REFERENCE TO RELATED APPLICATION

This application is based upon and claims the benefit of priority from Japanese Patent Application No. 2017-239005, filed on Dec. 13, 2017, the entire contents of which are incorporated herein by reference.

TECHNICAL FIELD

The present disclosure relates to a technique of processing a substrate by vaporizing a solid raw material or a liquid raw material and supplying a vaporized raw material gas thus obtained to a substrate processing part.

BACKGROUND

As a film-forming process which is one of the processes for manufacturing a semiconductor, there is a so-called atomic layer deposition (ALD) which alternately supplies a raw material gas and a reaction gas for, for example, oxidizing, nitriding or reducing the raw material gas, and there is a chemical vapor deposition (CVD) which decomposes a raw material gas in gas phase or reacts the raw material gas with a reaction gas, or the like. As the raw material gas used for such a film-forming process, a gas obtained by subliming a solid raw material may be used to increase the denseness of crystals after film formation and to reduce the amount of impurity introduced into the substrate as much as possible. For example, such a gas is used when forming a wiring film.

As a raw material supply device using a solid raw material, there is known a configuration in which a carrier gas that is an inert gas, for example, a nitrogen gas, is supplied into a raw material container surrounded by a heater, and a sublimed gas is supplied into a process chamber together with the carrier gas via a gas supply path. As described above, the raw material gas is a mixture of the carrier gas and a gaseous raw material. In order to control the thickness and the film quality of a film formed on the substrate, it is necessary to accurately adjust the amount of the raw material (an actual flow rate of a vaporized raw material contained in the raw material gas).

Conventionally, in order to stabilize a flow rate of a raw material gas, a correction factor indicating a correlation between an increase/decrease amount of a flow rate of a carrier gas and an increase/decrease amount of a vaporized raw material measured when the carrier gas is increased or decreased is stored in advance in a control part. Furthermore, when an actual flow rate of the vaporized raw material is varied, a correction amount of the carrier gas with respect to a variation of the vaporized raw material is calculated based on the correction factor. A flow rate of the vaporized raw material is controlled by adjusting the flow rate of the carrier gas according to the correction amount of the carrier gas. However, when the remaining amount of the solid raw material in the raw material container is varied, a value of the correction factor indicating the correlation between the increase/decrease amount of the flow rate of the carrier gas and the increase/decrease amount of the measured vaporized raw material tends to vary. Therefore, when the raw material in the raw material container is drastically decreased, it was necessary to stop the device and newly reset the correction factor. In addition, when the processing of the substrate starts from an idle operation, the vaporization amount of the raw material may temporarily increase. Thus, there may be a case where the flow rate of the vaporized raw material is not based on the correction factor with respect to the flow rate of the carrier gas. For example, in the case of processing an initial substrate of a lot, the supply amount of the vaporized raw material may not be stabilized.

SUMMARY

Some embodiments of the present disclosure provide a technique of stabilizing a supply amount of a raw material to be supplied to a substrate processing part when a substrate is processed by supplying a vaporized raw material to the substrate processing part.

According to one embodiment of the present disclosure, there is provided a method of processing each of a plurality of substrates by supplying a carrier gas having a flow rate adjusted by a mass flow controller to a raw material container, and supplying a vaporized raw material obtained by vaporizing a solid or liquid raw material inside the raw material container together with the carrier gas to a substrate processing part via a raw material gas supply path in which a mass flow meter is installed, the method including: obtaining a first correction factor based on a first flow rate set value of the mass flow controller and a first measurement value of the mass flow meter by supplying the carrier gas to the raw material container, the first correction factor being a ratio of a flow rate of the vaporized raw material to a flow rate of the carrier gas; adjusting the first flow rate set value of the mass flow controller with the first correction factor so that the flow rate of the vaporized raw material becomes equal to a target value to process the substrate; after the step of obtaining the first correction factor, obtaining a second correction factor based on a second flow rate set value of the mass flow controller and a second measurement value of the mass flow meter by supplying the carrier gas to the raw material container, the second correction factor being a ratio of the flow rate of the vaporized raw material to the flow rate of the carrier gas; and adjusting the second flow rate set value of the mass flow controller with the second correction factor so that the flow rate of the vaporized raw material becomes equal to the target value to process the substrate.

According to another embodiment of the present disclosure, there is provided a non-transitory computer-readable storage medium storing a computer program for use in a substrate processing apparatus which processes each of a plurality of substrates by supplying a carrier gas having a flow rate adjusted by a mass flow controller to a raw material container and supplying a vaporized raw material obtained by vaporizing a solid or liquid raw material in the raw material container together with the carrier gas to a substrate processing part via a raw material gas supply path in which a mass flow meter is installed, wherein the computer program includes a group of steps for executing the aforementioned method.

According to another embodiment of the present disclosure, there is provided a raw material gas supply device for supplying a carrier gas having a flow rate adjusted by a mass flow controller to a raw material container and supplying a vaporized raw material obtained by vaporizing a solid or liquid raw material in the raw material container together with the carrier gas to a substrate processing part via a raw material gas supply path in which a mass flow meter is installed, the raw material gas supply device including: a controller configured to perform: obtaining a first correction factor based on a first flow rate set value of the mass flow controller and a first measurement value of the mass flow meter by supplying the carrier gas to the raw material container, the first correction factor being a ratio of a flow rate of the vaporized raw material to a flow rate of the carrier gas; adjusting the first flow rate set value of the mass flow controller with the first correction factor so that the flow rate of the vaporized raw material becomes equal to a target value to process the substrate; after the step of obtaining the first correction factor, obtaining a second correction factor based on a second flow rate set value of the mass flow controller and a second measurement value of the mass flow meter by supplying the carrier gas to the raw material container, the second correction factor being a ratio of the flow rate of the vaporized raw material to the flow rate of the carrier gas; and adjusting the second flow rate set value of the mass flow controller with the second correction factor so that the flow rate of the vaporized raw material becomes equal to the target value to process the substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 6A and 6B are time charts illustrating opening and closing of a valve and a time-dependent change in a flow rate of a vaporized raw material supplied from a raw material gas supply part.

FIG. 7 is a characteristic diagram illustrating an example of measurement values measured by an MFM (mass flow meter).

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
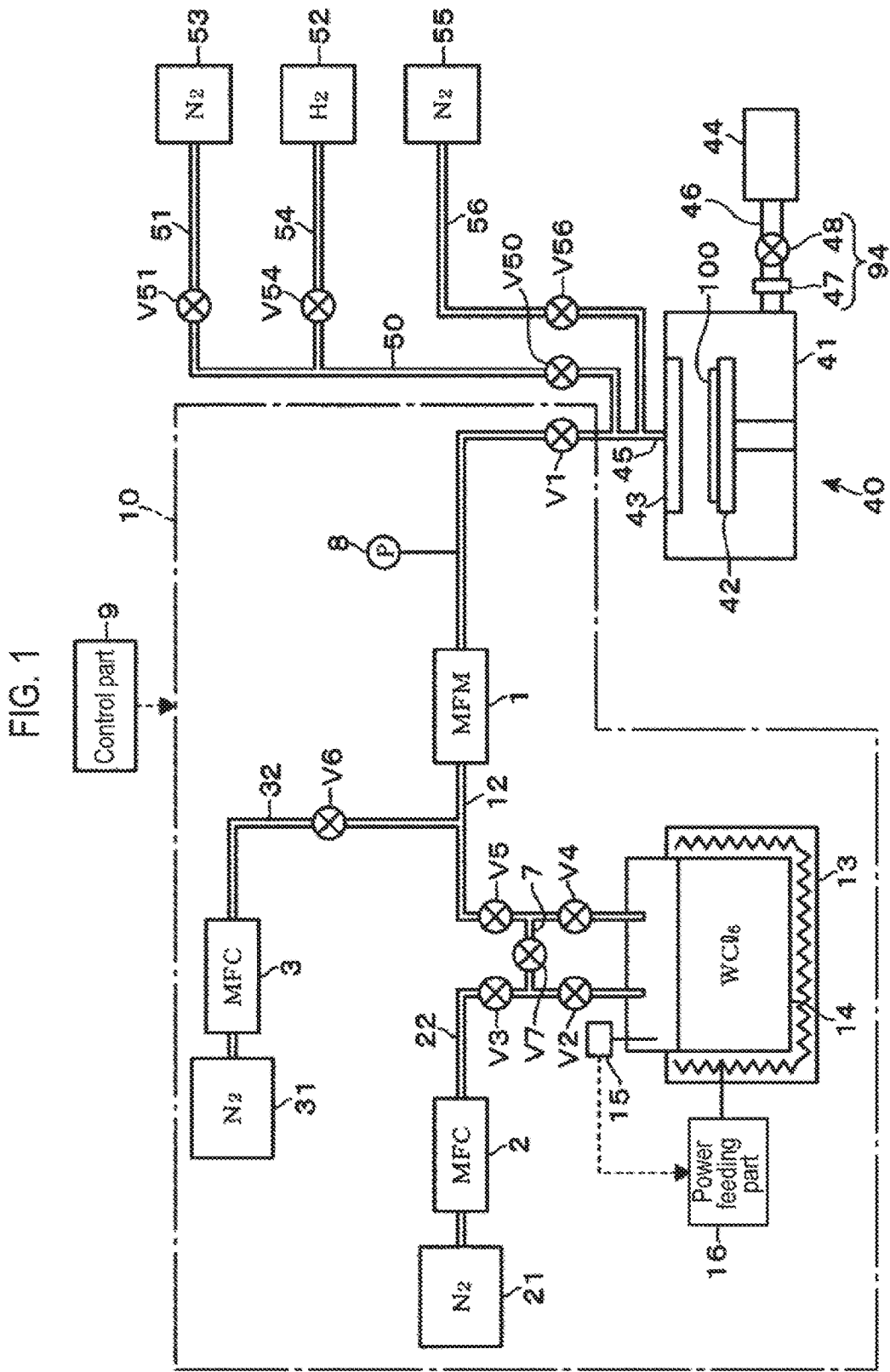
FIG. 1 is an overall configuration diagram illustrating a film-forming apparatus to which a substrate processing apparatus according to an embodiment of the present disclosure is applied.

An example of a configuration in which a raw material gas supply device of the present disclosure is applied to a film-forming apparatus will be described. As illustrated in FIG. 1, the film-forming apparatus includes a film-forming processing part 40 which is a substrate processing part for performing an ALD-based film-forming process on a semiconductor wafer (hereinafter referred to as a "wafer") 100 as a substrate, and a raw material gas supply part 10 configured by a raw material gas supply device to supply a raw material gas to the film-forming processing part 40. In the present disclosure, the raw material gas is a gas obtained by combining a carrier gas and a vaporized (sublimed) raw material which flows together with the carrier gas.

The raw material gas supply part 10 includes a raw material container 14 which accommodates $WCl_6$ as a raw material. The raw material container 14 is a container which accommodates $WCl_6$ staying in a solid state at room temperature. The raw material container 14 is covered with a jacket-like heating part 13 having a resistance heating element. The raw material container 14 is configured such that an internal temperature of the raw material raw container 14 can be adjusted by increasing or decreasing an amount of electric power supplied from a power feeding part 16 based on an temperature of the raw material container 14 detected by a temperature detection part 15. The temperature of the heating part 13 when the operation of the device starts is set at a temperature, e.g., 160 degrees C., which falls within a range where the solid raw material sublimates and $WCl_6$ is not decomposed.

A downstream end portion of a carrier gas supply path 22 and an upstream end portion of a raw material gas supply path 12 are inserted into a gas phase portion formed above the solid raw material inside the raw material container 14. A carrier gas supply source 21, which is a supply source of a carrier gas, for example, an $N_2$ gas, is installed at the upstream end of the carrier gas supply path 22. A first mass flow controller (MFC) 2, a valve V3, and a valve V2 are installed in the carrier gas supply path 22 sequentially from the upstream side.

Meanwhile, a valve V4, a valve V5, a mass flow meter (MFM) 1 which is a flow rate measuring part, and a valve V1 are installed in the raw material gas supply path 12 from the upstream side. In FIG. 1, reference numeral 8 is a manometer for measuring a pressure of a gas supplied from the raw material gas supply path 12. Since a reaction gas and a substitution gas as described hereinbelow also flow through the vicinity of the downstream end of the raw material gas supply path 12, the respective path is indicated as a gas supply path 45. In addition, a downstream end portion of a dilution gas supply path 32 through which a dilution gas is supplied, is joined with the upstream side of the MFM 1 in the raw material gas supply path 12. A dilution gas supply source 31, which is a supply source of the dilution gas, for example, an $N_2$ gas, is installed at the upstream end of the dilution gas supply path 32. A second mass flow controller (MFC) 3 and a valve V6 are installed in the dilution gas supply channel 32 from the upstream side. The valve V2 and the valve V3 in the carrier gas supply path 22 and the valve V4 and the valve V5 in the raw material gas supply path 12 are connected by a bypass flow path 7 in which a valve V7 is installed. A combination of the valves V2, V4 and V7 corresponds to a switching mechanism.

Next, the film-forming processing part 40 will be described. For example, the film-forming processing part 40 includes a mounting table 42 provided with a heater (not shown) and configured to hold the wafer 100 in a horizontal posture inside a vacuum container 41, and a gas introduction part 43 for introducing a raw material gas or the like into the vacuum container 41 therethrough. The gas supply path 45 is connected to the gas introduction part 43. A gas supplied from the raw material gas supply part 10 is supplied into the vacuum container 41 via the gas introduction part 43. In addition, a vacuum exhaust part 44 is coupled to the vacuum container 41 via an exhaust pipe 46. A pressure regulation valve 47 and a valve 48, which constitute a pressure regulation part 94 for regulating an internal pressure of the film-forming processing part 40, are installed in the exhaust pipe 46.

Furthermore, a reaction gas supply pipe 50 for supplying a reaction gas reacting with the raw material gas and a substitution gas supply pipe 56 for supplying a substitution gas are joined in the gas supply path 45. An upstream side of the reaction gas supply pipe 50 is branched into an $H_2$ gas supply pipe 54 connected to a supply source 52 of a reaction gas, for example, a hydrogen ($H_2$) gas, and an inert gas supply pipe 51 connected to a supply source 53 of an inert gas, for example, a nitrogen ($N_2$) gas. Also, an upstream side of the substitution gas supply pipe 56 is connected to a supply source 55 of the substitution gas, for example, an $N_2$ gas. In FIG. 1, reference symbols V50, V51, V54 and V56 are valves respectively installed in the reaction gas supply pipe 50, the inert gas supply pipe 51, the $H_2$ gas supply pipe 54 and the substitution gas supply pipe 56.

As will be described later, a process of forming a tungsten (W) film as one kind of metal film, which is performed in the film-forming processing part 40, includes supplying a raw material gas containing a vaporized raw material obtained by vaporizing $WCl_6$ as a solid raw material and an $H_2$ gas as a reaction gas in an alternate and repetitive manner onto the wafer 100, and supplying a substitution gas for substituting the internal atmosphere of the vacuum container 41 between the supply of the raw material gas and the supply of the reaction gas. In this manner, the raw material gas is intermittently supplied to the film-forming processing part 40 while alternately repeating a supply time period during which gas is supplied and an idle time period during which no gas is supplied. The supply of the raw material gas is controlled by turning on or turning off the valve V1. The valve V1 is configured so as to be opened and closed by a control part 9 as described hereinbelow. Here, the "turn on" means a state where the valve V1 is opened, and the "turn off" means a state where the valve V1 is closed.

Figure 2:
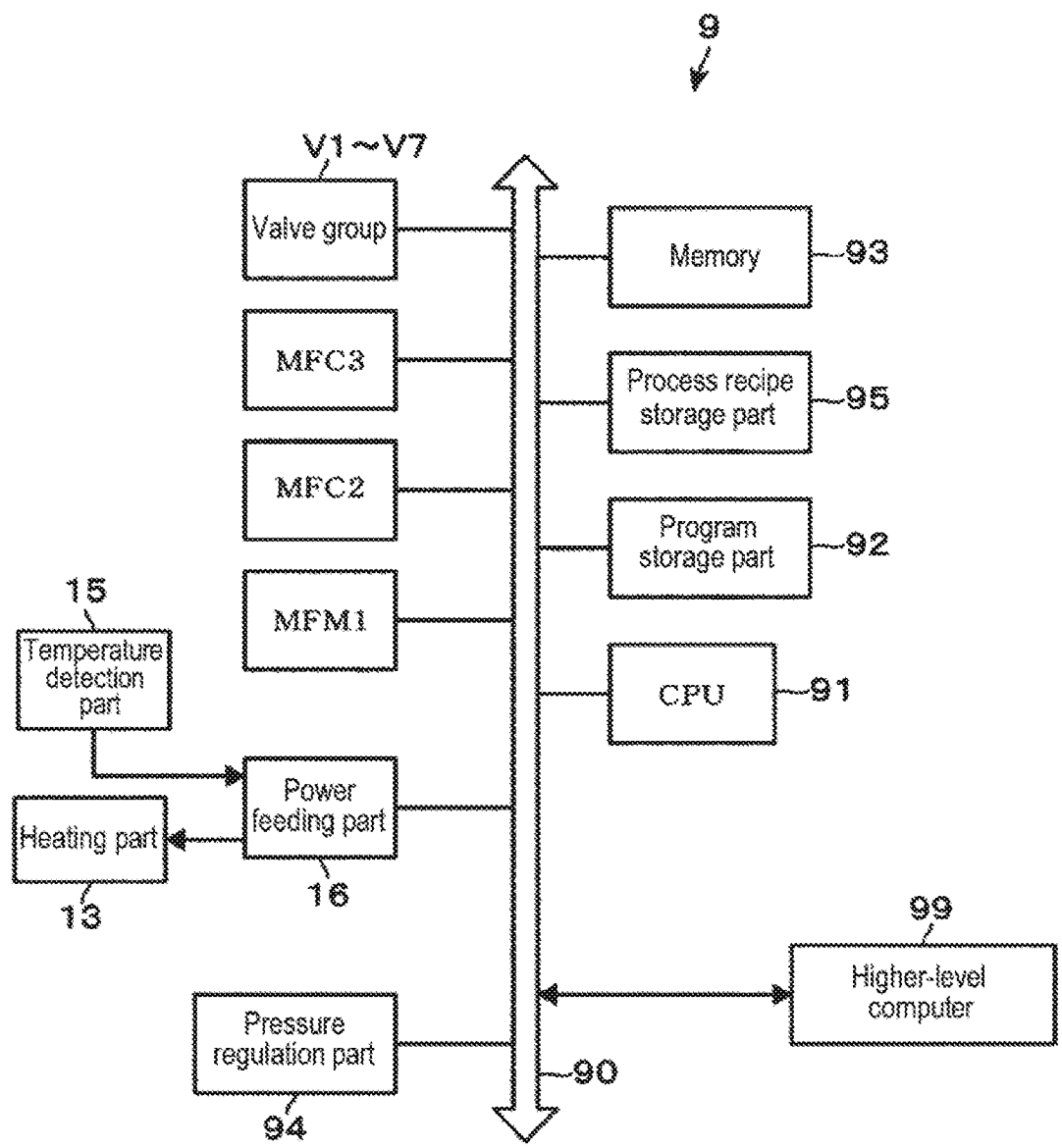
FIG. 2 is a configuration diagram illustrating a control part installed in the substrate processing apparatus.

The control part 9 is installed in the raw material gas supply part 10. As illustrated in FIG. 2, the control part 9 includes a CPU 91, a program storage part 92, a memory 93, and a process recipe storage part 95 in which a process recipe for a film-forming process performed on the wafer 100 is stored. In FIG. 2, reference numeral 90 is a bus. Furthermore, the control part 9 is connected to each of the valves V1 to V7, the MFM 1, the MFC 2, the MFC 3, and the pressure regulation part 94 connected to the film-forming processing part 40. In addition, the control part 9 is connected to the power feeding part 16, and is configured such that the heating temperature of the heating part 13 of the raw material container 14 by the power feeding part 16 can be adjusted. The control part 9 is also connected to a higher-level computer 99. For example, a process recipe related to the film-forming process of a lot of the wafer 100 loaded into the film-forming apparatus is sent from the higher-level computer 99 and is stored in the process recipe storage part 95.

The process recipe is information specifying a procedure of the film-forming process of the wafer 100 set for each lot together with processing conditions. The processing conditions may include a process pressure, a timing of the supply and cutoff of a gas to the film-forming processing part 40 by the ALD method, a flow rate of the raw material gas, and the like. The ALD method will be briefly described. First, a $WCl_6$ gas as a raw material gas is supplied for, e.g., 1 second, and the valve V1 is closed, so that $WCl_6$ is adsorbed onto the surface of the wafer 100. Subsequently, a substitution gas ($N_2$ gas) is supplied into the vacuum container 41 to substitute the internal atmosphere of the vacuum container 41. Subsequently, a reaction gas ($H_2$ gas) is supplied to the vacuum container 41 together with a dilution gas ($N_2$ gas). Then, an atomic film of a tungsten (W) film is formed on the surface of the wafer 100 by hydrolysis and desulfurization reaction. Thereafter, the substitution gas is supplied into the vacuum container 41 to substitute the internal atmosphere of the vacuum container 41. In this manner, the W film is formed by repeating a cycle which includes supplying the raw material gas containing $WCl_6 \rightarrow$ the substitution gas $\rightarrow$ the reaction gas $\rightarrow$ the substitution gas in this order into the vacuum chamber 41 multiple times.

Since the ALD method executes the cycle which sequentially supplies the raw material gas, the substitution gas, the reaction gas, the substitution gas multiple times, the timing of the turn-on signal and the turn-off signal is determined by a recipe defining the cycle. For example, since the supply and cutoff of the raw material gas is performed by the valve V1, a time period from the turn-on signal to the turn-off signal of the valve V1 corresponds to the supply time period of the raw material gas, and a time period from the turn-off signal to the turn-on signal of the valve V1 corresponds to the idle time period of the raw material gas. In the case of using the ALD method when obtaining a measurement value of the flow rate of the vaporized raw material by the MFM 1, the MFC 2 and the MFC 3, since the raw material gas is intermittently supplied and thus its supply time period is short, the measurement value of the flow rate rises and falls before it is stabilized. This destabilizes the measurement value. Therefore, in this example, the measurement value obtained by each of the MFM 1, the MFC 2 and the MFC 3 is calculated by using a value obtained by dividing an integral value of the measurement value of the flow rate in one cycle of the turn-on and the turn-off of the valve V1 by the time period of one cycle as a measurement output value (indication value), as will be described in detail later.

Information indicating a relationship between an increase/decrease amount of the flow rate of the carrier gas and an increase/decrease amount of the flow rate of the vaporized raw material flowing through the raw material gas supply path 12 together with the carrier gas, for example, a relational equation, is stored in the memory 93. This relational equation is approximated by a linear equation, such as the following equation (1).

Increase/decrease amount of flow rate of carrier gas=correction factor $K_n \times$ increase/decrease amount of flow rate of vaporized raw material   Eq. (1)

A relational equation for calculating the correction factor $K_n$ is also stored in the memory 93. Assuming that a measurement value of the flow rate of the vaporized raw material available when processing an nth wafer 100 is $Pr_n$, and a measurement value of the flow rate of the carrier gas available when processing the nth wafer 100 is $C_n$, the relational equation is approximated by an equation, such as the following equation (2).

$$\text{Correction factor } K_n = (C_n - C_{n-1})/(Pr_n - Pr_{n-1}) \qquad \text{Eq. (2)}$$

Assuming that in Eq. (2), $(C_n - C_{n-1})$ is $\Delta C_n$ and $(Pr_n - Pr_{n-1})$ is $\Delta Pr_n$, $\Delta C_n$ = correction factor $K_n \times \Delta Pr_n$, and assuming that the horizontal axis is $\Delta Pr_n$ and the vertical axis is $\Delta C_n$, it becomes a linear equation of the correction factor $K_n$ of slope as indicated by graph I in FIG. 3.

In this embodiment, the correction factor $K_n$ calculated from the increase/decrease amount of the flow rate of the carrier gas and the increase/decrease amount of the flow rate of the vaporized raw material corresponds to a ratio of the flow rate of the vaporized raw material and the flow rate of the carrier gas.

In addition, the memory 93 stores a data table configured to write $C_n$, $C_{n-1}$, $Pr_n$ and $Pr_{n-1}$. As will be described later, the data table is configured to be rewritable as the processing of the wafer 100 is performed.

Furthermore, the memory 93 stores a first threshold value used for setting an allowable range of a first correction factor of the correction factor $K_n$ for determining that there is not much left of the raw material charged in the raw material container 14, and a second threshold value used for setting an allowable range of a second correction factor of the correction factor $K_n$ for determining that the amount of the raw material inside the raw material container 14 is decreased and thus the vaporization amount of the raw material is decreased.

Figure 3:
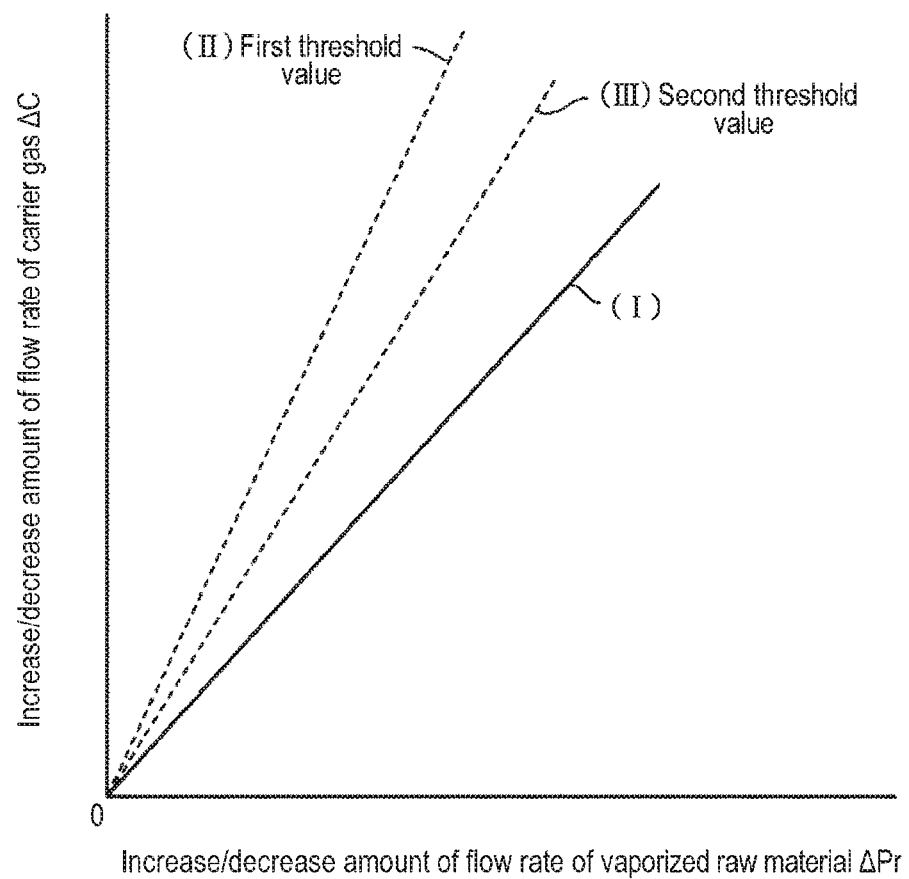
FIG. 3 is a characteristic diagram illustrating an increase/decrease amount of a flow rate of a vaporized raw material and an increase/decrease amount of a flow rate of a carrier gas.

Referring to FIG. 3, when the heating temperature of the raw material container 14 is kept constant, if the remaining amount of the raw material becomes small, the vaporization amount of the raw material becomes small. Thus, it is necessary to allow more carrier gas to flow in order to supply a certain amount of raw material.

Therefore, when the remaining amount of the raw material becomes smaller than that in graph I of FIG. 3, the correction factor $K_n$ of slope has a steep gradient. Furthermore, when the remaining amount of the raw material is larger than that in graph I, the vaporization amount of the raw material is increased. Thus, the correction factor $K_n$ of slope has a gentle gradient. Accordingly, since it can be confirmed that the remaining amount of the raw material is reduced based on the slope of the graph in FIG. 3, namely the increase in the value of the correction factor $K_n$, it is possible to determine a timing at which the raw material container 14 is to be exchanged. Therefore, the correction factor $K_n$ when there remains a little of the raw material stored in the raw material container 14 (graph II in FIG. 3) is set as the first threshold value.

Furthermore, even if the exchange timing of the raw material container 14 has not been reached, when the vaporization amount of the raw material becomes small, the flow rate of the vaporized raw material per unit flow rate of the carrier gas becomes small. This increases the flow rate of the carrier gas necessary to change the flow rate of the vaporized raw material. In addition, since it is impossible to make adjustment so as to deviate from the adjustment range of the flow rate of the carrier gas, it is necessary to set the correction factor $K_n$ whose value can be adjusted within a range where the flow rate of the carrier gas can be adjusted, for example, within a flow rate range of 0 to 1.400 sccm of the carrier gas. Therefore, the correction factor $K_n$ when the amount of raw material in the raw material container 14 becomes small (graph III in FIG. 3) is set as the second threshold value used for increasing the vaporization amount of the raw material by raising the heating temperature of the raw material container 14.

Figure 4:
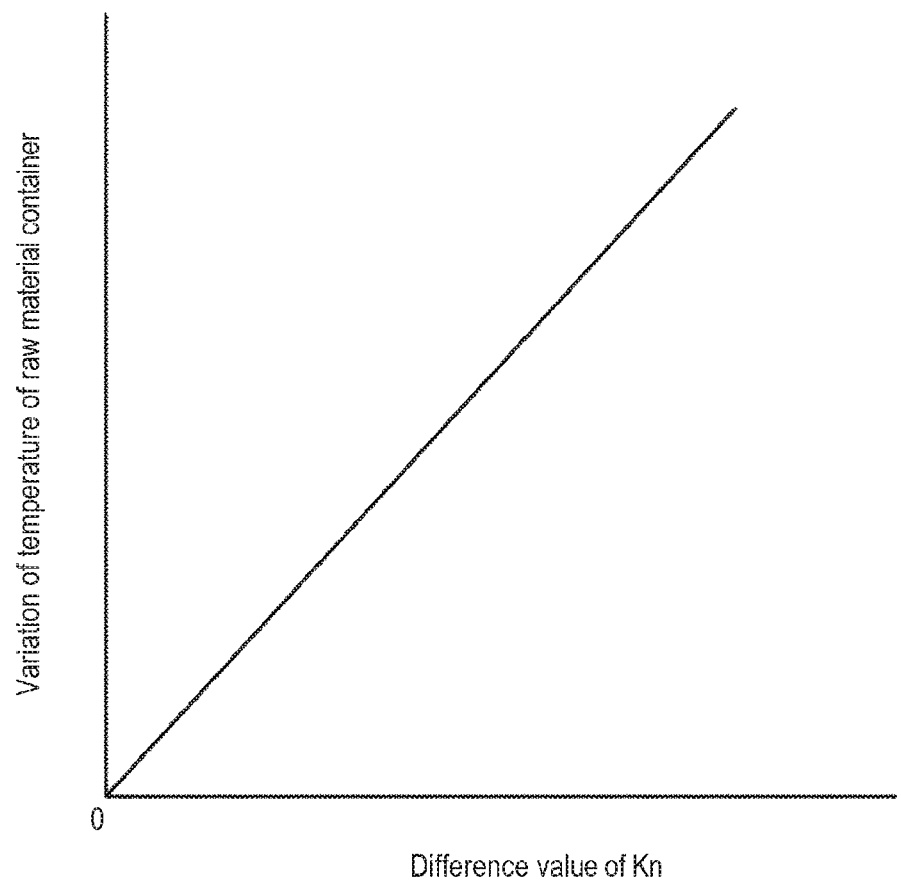
FIG. 4 is a characteristic diagram illustrating a variation of a correction factor $K_n$ and a variation of a temperature of a raw material container.

In addition, the memory 93 stores a relational equation used for calculating the temperature rising amount of the raw material container 14 when the correction factor $K_n$ exceeds the second threshold value. FIG. 4 is a characteristic diagram schematically illustrating an example of such a relational equation, in which the horizontal axis indicates a variation of the correction factor $K_n$ and the vertical axis indicates a variation of the temperature. Furthermore, when the correction factor $K_n$ exceeds the second threshold value, if the vaporization amount of the raw material is sufficient, for example, if the amount of the raw material charged in the raw material container 14 is the maximum, the variation of the temperature of the raw material container 14 is calculated from a difference value between a value of the correction factor $K_n$ when the heating temperature of the raw material container 14 is 170 degrees C. and a value of the correction factor $K_n$ measured when processing the nth wafer 100. The calculated variation is sent to the heating part of the raw material container 14. The value of the correction factor $K_n$ available when the vaporization amount of the raw material is sufficient, namely a reference correction factor $K_A$, is for example a correction factor set from a correlation between the increase/decrease amount of the carrier gas in a case where the heating temperature of the raw material container 14 is set at 170 degrees C. when the raw material is charged at the maximum and the increase/decrease amount of the vaporized raw material, and is stored in the memory 93.

A program stored in the program storage part 92 has a group of steps for executing the operation of the raw material gas supply part 10 in the film-forming apparatus. The term "program" used herein encompasses software such as a process recipe or the like. The group of steps includes a step of integrating the measurement output of the flow rate of each of the MFM 1, the MFC 2 and the MFC 3 for the supply time period and operating the respective integral value as a flow rate value of the supply time period. A hardware configuration using a time constant circuit may be used for the operation process of integration. The program is stored in, for example, a storage medium such as a hard disk, a compact disc, a magnet optical disc, a memory card or the like, and is installed on a computer.

An operation of the film-forming apparatus according to an embodiment of the present disclosure will be described with reference to a flowchart illustrated in FIG. 5. Here, it is assumed that two or more wafers 100, for example, 25 wafers 100, are included in one lot.

First, for example, as illustrated in step S1, a correction factor $K_0$ corresponding to a first correction factor for determining a flow rate of a carrier gas when processing a first wafer 100 in the lot is acquired by executing a dummy recipe.

In the present embodiment, the dummy recipe executes a first dummy process of supplying a carrier gas to the film-forming processing part 40 by opening and closing a valve at the same timing as in the process recipe while bypassing the raw material container 14, and a second dummy process of supplying the carrier gas to the film-forming processing part 40 by opening and closing the valve at the same timing as in the process recipe while supplying the carrier gas to the raw material container 14. Here, in the dummy recipe, the second dummy process is repeated twice after performing the first dummy process once.

The dummy recipe is executed in a state in which the wafer 100 is not transferred to the film-forming processing part. First, the dummy recipe is performed by setting set values of the MFC 2 and the MFC 3 to a flow rate value of the carrier gas and a flow rate value of a dilution gas determined in advance, according to a target value of the flow rate of the raw material gas, which is written in the process recipe.

In some embodiments, the dummy recipe may be executed in a state in which, for example, a dummy wafer is loaded into the film-forming processing part 40. The set value of the MFC 2 is determined based on the reference correction factor $K_A$ which is set in advance and the target value of the flow rate of the vaporized raw material in the process recipe when the raw material container 14 is heated at a set temperature of the process recipe, for example, 170 degrees C., for example, in a state in which the raw material container 14 is filled with the maximum amount of the solid raw material (set value of MFC 2=correction factor $K_A$×target value of flow rate of vaporized raw material).

In the setting of the flow rate of the dilution gas, when the flow rate of the vaporized raw material is small, for example, when the total flow rate of the raw material gas diluted with the dilution gas is determined as the total flow rate of the carrier gas and the dilution gas, the flow rate of the dilution gas is determined as a value obtained by subtracting the set value of the flow rate of the carrier gas from the total flow rate. Furthermore, assuming that the flow rate of the vaporized raw material is included in the total flow rate, the target value of the supply amount of the raw material is handled as, for example, a weight per unit time. Thus, the total flow rate and the flow rate of the carrier gas for supplying the raw material are obtained based on the process pressure and the target value of the supply amount of the raw material. Accordingly, the value obtained by subtracting the total value of the supply amount of the raw material and the flow rate of the carrier gas from the total flow rate corresponds to the set value of the flow rate of the dilution gas.

In addition, in the process recipe, the valve V1 is set to be opened and closed at the same schedule as the supply time period and the idle time period of the raw material gas supplied to the film-forming processing part 40. An internal pressure of the film-forming processing part 40 in the dummy recipe is set at a pressure determined by the process recipe for operation.

The operation of the dummy recipe will be described. First, in the first dummy process, the valves V3, V5, V6 and V7 are opened. After time t0, the valve V1 is opened and closed in the same cycle as the opening/closing timing of the valve V1 in the process recipe. Here, for example, in a time interval between time t0 and time t100, the operation of opening the valve V1 for 1 second and closing the valve V1 for 1 second is repeated 100 times. The interior of the vacuum container 41 has already been vacuum-exhausted. Accordingly, the carrier gas flows from the carrier gas supply source 21 in the order of the carrier gas supply path 22 and the bypass flow path 7 at a flow rate corresponding to the set value of the MFC 2, and flows through the raw material gas supply path 12 (bypass flow). Thereafter, in the raw material gas supply path 12, the carrier gas is mixed with the dilution gas supplied from the dilution gas supply path 32 and flows through the MFM 1. In this way, the mixture gas of the carrier gas and the dilution gas flows intermittently into the film-forming processing part 40. By the first dummy process, the correlation (offset value) between the flow rates by the MFM 1, the MFC 2 and the MFC 3 is recognized. This offset value is a correction value for correcting an error of specified values between the MFM 1, the MFC 2 and the MFC 3. In the following description, the values measured at the MFM 1, the MFC 2 and the MFC 3 are ones calculated by correcting values indicated at the MFM 1, the MFC 2 and the MFC 3 with the offset value.

Subsequently, in the second dummy process, at the time t0, the valve V7 is closed and the valves V2 and V4 are opened. Accordingly, the carrier gas is supplied from the carrier gas supply path 22 into the raw material container 14 at the flow rate set by the MFC 2, and the raw material vaporized inside the raw material container 14 flows through the raw material gas supply path 12 together with the carrier gas. Furthermore, the dilution gas flowing into the raw material gas supply path 12 from the dilution gas supply path 32 is joined. Then, from time t0, the valve V1 is opened and closed in the cycle of opening and closing the valve V1 in the process recipe. In this case, the operation of opening the valve V1 for 1 second and closing the valve V1 for 1 second is repeated. Accordingly, the raw material gas mixed with the dilution gas is sent to the film-forming processing part 40 (auto-flow). Thus, the carrier gas is supplied into the raw material container 14 and the raw material gas is supplied to the film-forming processing part 40, using the flow rate value of the carrier gas, the flow rate value of the dilution gas, the internal pressure of the film-forming processing part 40 and the cycle of opening and closing the valve V1 as the same set values as those in the first dummy process.

Then, when the second dummy process is performed twice, the flow rate of the gas in each of the MFM 1, the MFC 2 and the MFC 3 is measured, and a flow rate $C_n$ of the carrier gas and an actual flow rate $Pr_n$ of the vaporized raw material in each of the second dummy processes are measured. Furthermore, the correction factor $K_O$ for determining the flow rate of the carrier gas in the processing of the first wafer 100 is set based on $C_n$ and $Pr_n$. The operation of measuring the flow rate $C_n$ of the carrier gas and the actual flow rate $Pr_n$ of the vaporized raw material to acquire the correction factor $K_n$ corresponds to an acquisition operation. In the present embodiment, the acquisition operation performed in the second dummy process corresponds to a first acquisition operation.

FIG. 6A illustrates a state of the valve V1 for performing the supply and cutoff of the raw material gas in the time interval between times t0 to t100. In FIG. 6A, each ON time zone corresponds to the supply time period of the raw material gas and each OFF time zone corresponds to the idle time period of the raw material gas. FIG. 6B illustrates transition of a measurement output of the flow rate of the raw material gas measured by the MFM 1, for example, in the time interval between times t0 to t100. Since a time period during which the valve V1 is opened is short as described above, the measurement output of the flow rate of the raw material gas measured by the MFM 1 manifests a pattern in which it rapidly rises after an ON command of the valve V1 and falls immediately after an OFF command of the valve V1. A ratio between the supply time period and the idle time period in FIG. 6A is shown for the sake of convenience.

Therefore, the measurement output of the flow rate of each of the MFM 1, the MFC 2 and the MFC 3 is integrated by the control part 9 for one cycle of the supply and cutoff of the raw material gas. A value obtained by dividing the respective integral value by a time T of one cycle is set to a measurement value of the flow rate. Based on the ON command of the valve V1 illustrated in FIG. 6A, for example, the integral operation of the flow rate of the gas starts at time to, and the integral operation is completed at time t1 when a subsequent ON command of the valve V1 is issued. A time interval between times t0 to t1 is referred to as one cycle.

Furthermore, the integral value obtained by integrating the flow rate in the time interval between times t0 and t1 in each of the MFM 1, the MFC 2 and the MFC 3, is divided by the time T of one cycle, namely the values (integral value/(t1−t0) obtained by dividing the integral value by the time period (t1−t0) from times t0 to t1, are respectively assumed to be a measurement value m1 of the MFM 1, a measurement value m2 of the MFC 2 and a measurement value m3 of the MFC 3 from the times t0 to t1. In this manner, in each cycle from times t0 to t1, from times t1 to t2, . . . , the values of m1, m2 and m3 are obtained. FIG. 7 illustrates an example of the valve m1 in each cycle of t0 to t1, t1 to t2, . . . , measured by the MFM 1.

When a gas is supplied to the film-forming processing part 40, the flow rate of the gas tends to be difficult to stabilize some time after starting the supply of the gas. For example, assuming that the supply and cutoff of the raw material gas are performed 100 cycles in the time interval between time t0 at which the process recipe is executed and time t1100. Therefore, for example, as illustrated in FIG. 7, an average value M1 of measurement values of the MFM 1 is calculated by averaging five measurement values respectively measured in last five cycles from the 96th cycle to the 100th cycle in the process recipe. Similarly, even in the MFC 2 and the MFC 3, an average value M2 of measurement values of the MFC 2 and an average value M3 of measurement values of the MFC 3 are calculated by averaging five measurement values respectively measured in last five cycles from the 96th cycle to the 100th cycle in the process recipe. In the present embodiment, the average value M1 of the measurement values of the MFM 1, the average value M2 of the measurement values of the MFC 2 and the average value M3 of the measurement values of the MFC 3 correspond to the measurement value of the MFM 1, the measurement value of the MFC 2, and the measurement value of the MFC 3. Further, the "set value of the MFC 2" and the "set value of the MFC 3" are regarded as being included in the measurement value of the MFC 2 and the measurement value of the MFC 3.

Then, based on the average values M1, M2 and M3 obtained at the first round of the second dummy process, an actual flow rate $Pr_a$ of the vaporized raw material and an actual flow rate $C_a$ of the carrier gas at the first round of the second dummy process are calculated (actual flow rate $Pr_a$ of vaporized raw material $Pr_a$=M1−(M2+M3) and actual flow rate $C_a$ of carrier gas $C_a$=M2).

Furthermore, at the second round of the second dummy process, for example, the increase/decrease amount of the carrier gas is calculated from the actual flow rate $Pr_a$ of the vaporized raw material at the first round of the second dummy process and the reference correction factor $K_A$, and a set value $C_b$ of the carrier gas at the second round of the second dummy process is determined. And then, the flow rate of the carrier gas is set to the set value $C_b$, and the second round of the second dummy process is performed so that an actual flow rate $Pr_b$ of the vaporized raw material at the second round of the second dummy process is calculated based on the average values M1, M2 and M3. A first correction factor $K_0$ used for processing the first wafer 100 is calculated from $C_a$, $C_b$, $Pr_a$ and $Pr_b$ obtained by the two rounds of the second dummy processes (correction factor $K_0=(C_b-C_a)/(Pr_b-Pr_a)$).

Subsequently, at step S2 in FIG. 5, the number n of the wafer 100 is inputted as 1. At step S3, the first wafer 100 is loaded into the film-forming processing part 40, and the internal pressure of the film-forming processing part 40 is set at a pressure determined by the process recipe. Thereafter, as illustrated at step S4, an increase/decrease amount of the flow rate of the carrier gas in the processing of the first wafer 100 is calculated from the correction factor $K_0$ obtained in the dummy recipe and, for example, a difference between the actual flow rate $Pr_b$ of the vaporized raw material obtained at the second round of the second dummy process and the target value of the vaporized raw material, and the flow rate of the MFC2 is adjusted (increase/decrease amount of flow rate of carrier gas in processing of first wafer 100=correction factor $K_0$×difference value between actual flow rate $Pr_b$ of vaporized raw material and target value of vaporized raw material).

In addition, a flow rate of the dilution gas is set so that the total flow rate of the raw material gas is kept constant. To do this, the flow rate of the dilution gas is adjusted to a flow rate obtained by subtracting the flow rate of the carrier gas and a target flow rate of the vaporized raw material in the processing of the first wafer 100 from the total flow rate of the raw material gas (flow rate of dilution gas in processing of first wafer 100=total flow rate of raw material gas−(set value of flow rate of carrier gas+target value of flow rate of vaporized raw material in processing of first wafer 100)).

Subsequently, the process goes to step S5 where the valve V1 is opened and closed at the same timing as that in the second dummy process according to the process recipe. Accordingly, the carrier gas having a flow rate adjusted based on the correction factor $K_0$ flows so that the raw material gas is supplied into the film-forming processing part 40 to process the first wafer 100.

Then, when processing the first wafer 100, similar to the second dummy process at step S1, the average values M1, M2 and M3 in last five cycles among 100 cycles of the supply and cutoff of the gas performed in the process recipe are measured. An actual flow rate $Pr_1$ of the vaporized raw material in the processing of the first wafer 100 and an actual flow rate $C_1$ of the carrier gas in the processing of the first wafer 100 are calculated.

At step S6, the calculated $Pr_1$ and $C_1$, and the actual flow rate of the vaporized raw material and the flow rate of the carrier gas used for setting the correction factor $K_0$, for example, $Pr_b$ and $C_b$, are inputted to the data table for the correction factor calculation. At step S7, a correction factor $K_1$ is calculated from the data table for the correction factor calculation (correction factor $K_1=(C_1-C_b)/(Pr_1-Pr_b)$) and is set as a new correction factor $K_n$.

Subsequently, the process proceeds to step S8 where the first wafer 100 is unloaded. The process proceeds to step S9 where the newly-set correction factor $K_1$ is compared with the first threshold value. If it is determined that the correction factor $K_1$ does not exceed the first threshold value, namely if the determination result is "NO", the process proceeds to step S10.

At step S10, the correction factor $K_1$ is compared with the second threshold value. If it is determined that the correction factor $K_1$ does not exceed the second threshold value, namely if the determination result is "NO", the process proceeds to step S11. If it is determined at step S11 that the first wafer 100 is not the last wafer 100, the process proceeds to step S12 where the number n is set to 2. The process returns to step S3.

Subsequently, an nth wafer 100, i.e., a second wafer 100, is loaded into the film-forming processing part 40. At step S4, the flow rate of the carrier gas is increased or decreased so that the flow rate of the vaporized raw material is set to the target flow rate using the correction factor $K_1$. Then, the process proceeds to step S5 where the second wafer 100 is processed so that an actual flow rate $C_2$ of the carrier gas in the processing of the second wafer 100 and an actual flow rate $Pr_2$ of the vaporized raw material in the processing of the second wafer 100 are acquired. At step S6, these flow rates are inputted to the data table for the correction factor calculation. At step S7, a correction factor $K_2$ is calculated from the data table for the correction factor calculation (correction factor $K_2=(C_2-C_1)/(Pr_2-Pr_1)$ and is set as a new one. Subsequently, at steps S9 and S10, the correction factor $K_2$ is compared with the first threshold value and the second threshold value. In this manner, the series of steps S3 to S8, and the comparison process between the correction factor and the first and second threshold values performed at steps S9 and S10 are repeated so that all the wafers 100 of the lot are sequentially processed. The correction factor $K_1$ and the correction factors $K_2$ described above, and a correction factor $K_3$, . . . correspond to the second correction factor.

Figure 8A:
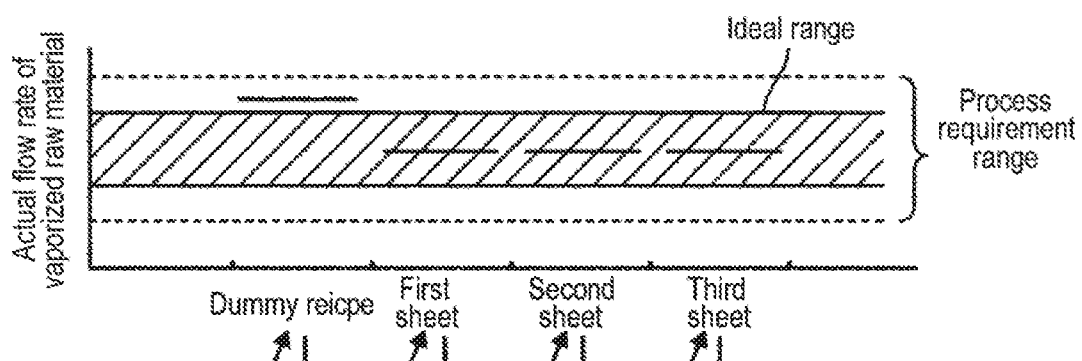
FIGS. 8A to 8C are explanatory diagrams illustrating an actual measurement value of a flow rate of a vaporized raw material when processing a dummy recipe and each wafer, and a value of a correction factor $K_n$.
Figure 8B:
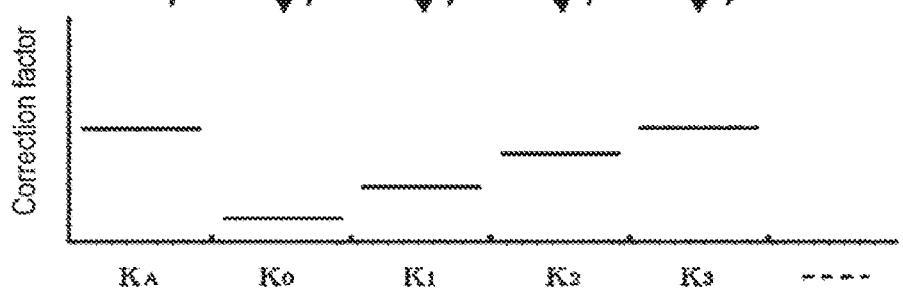
Figure 8C:
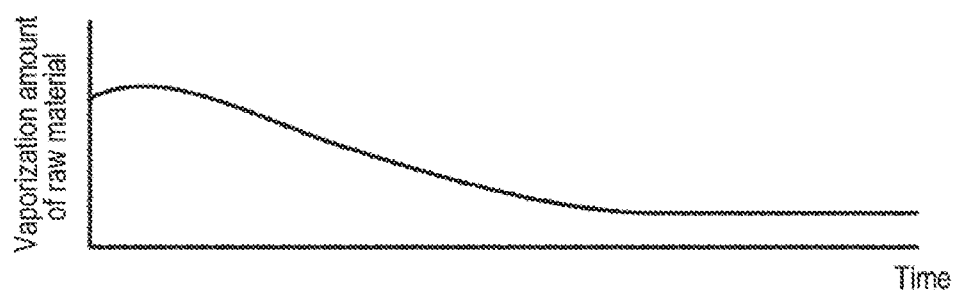

FIGS. 8A to 8C schematically illustrate an example of actual measurement values of the flow rate of the vaporized raw material, correction factors, and vaporization amounts of the raw material gas in the raw material container 14 at the time of executing the dummy recipe and at the time of processing each wafer 100, when performing the processing of each wafer 100, as described above. For example, in the idle state, the raw material is vaporized by heating the raw material container 14, but the supply of the carrier gas does not start. Then, when the processing of the first wafer 100 of the lot starts from the idle state, the supply of the carrier gas to the raw material container 14 starts so that the raw material gas is switched so as to be supplied to the film-forming processing part 40. However, in the idle state, since the vaporized raw material is not discharged from the raw material container 14, a concentration of the vaporized raw material inside the raw material container 14 tends to increase. For this reason, as illustrated in a graph of FIG. 8C, when the carrier gas is supplied to the raw material container 14 from the idle state to be switched into the supply of the raw material gas, the flow rate of the vaporized raw material temporarily increases immediately after the start, and thereafter gradually decreases. Therefore, in the dummy recipe, when the flow rate of the carrier gas is adjusted so as to supply the vaporized raw material having a target value using the preset correction factor $K_A$, the vaporized raw material is likely to more flow than the target value. Thus, the increase/decrease amount of the flow rate of the vaporized raw material with respect to the increase/decrease amount of the carrier gas is increased (the correction factor $K_n$ is smaller than the correction factor $K_A$). Therefore, when the flow rate value of the carrier gas is corrected using the correction factor $K_A$, the increase/decrease amount of the flow rate of the vaporized raw material may be larger than a target increase/decrease amount. Thus, as illustrated in FIG. 8A, even if the flow rate of the vaporized raw material falls within a range required for the processing in the dummy recipe, it may deviate from an ideal range. Furthermore, the tendency that the raw material is unlikely to be captured at a flow rate according to the correction factor $K_A$ with respect to the flow rate of the carrier gas may continue for some time by the process recipe. Thus, there may be a case where the actual flow rate of the vaporized raw material in the processing of the initial wafer 100 of the lot may deviate from the target value.

In the aforementioned embodiment, as illustrated in a graph of FIG. 8B, the correction factor $K_0$ in which an increase/decrease amount of the carrier gas is smaller than an increase/decrease amount of the flow rate of the vaporized raw material is reset based on the actual flow rate of the vaporized raw material and the set value of the flow rate of the carrier gas in the dummy recipe. Subsequently, when the processing of the first wafer 100 is performed, the flow rate of the carrier gas is adjusted by acquiring the increase/decrease amount of the carrier gas from a difference value between the actual flow rate $Pr_b$ of the vaporized raw material in the dummy recipe and the target value of the vaporized raw material, and the correction factor $K_0$. Accordingly, in the processing of the first wafer of the lot, since the vaporization amount of the raw material is large but the correction factor $K_0$ is reset to be smaller than the correction factor $K_A$, the actual flow rate of the vaporized raw material is not greatly changed. Thus, the flow rate of the vaporized raw material becomes a value closer to an ideal supply amount which falls within the process requirement range. Thereafter, while the number of processed wafers 100 increases, the vaporization amount of the raw material successively decreases. However, the correction factor $K_n$ is continuously corrected based on the measurement value $C_n$ of the carrier gas and the actual flow rate $Pr_n$ of the vaporized raw material when processing each wafer 100. In this example, since the correction factor $K_n$ is increased so as to respond to the gradual decrease of the vaporization amount of the raw material, the actual flow rate of the vaporized raw material supplied to each wafer 100 is stabilized. In this manner, in the initial stage of the film-forming process, the raw material is unlikely to be captured at a flow rate according to the correction factor $K_A$. However, as illustrated in FIG. 8A, the actual flow rate of the vaporized raw material in the processing of the first wafer 100 becomes a value close to the target value. Even in a subsequent wafer 100, since the increase/decrease amount of the carrier gas is adjusted based on the correction factor $K_n$ indicating the correlation between the actual flow rate of the carrier gas and the actual flow rate of the vaporized raw material in the immediately-preceding wafer 100, the supply amount of the vaporized raw material in the processing of each wafer 100 becomes close to the target value.

In addition, as the processing of the wafer 100 continues, the raw material charged in the raw material container 14 is decreased. Accordingly, as illustrated in a graph of FIG. 9C, the vaporization amount of the raw material is decreased so that the raw material captured by the carrier gas is gradually decreased. Thus, the increase/decrease amount of the vaporized raw material with respect to the increase/decrease amount of the carrier gas becomes small. Therefore, when the correction factor $K_n$ is set to have a constant value, the actual flow rate of the vaporized raw material may be gradually decreased from the target value of the vaporized raw material under the situation that the vaporized raw material is not sufficiently increased or decreased by the variation of the carrier gas calculated from the correction factor and the vaporization amount of the raw material is gradually decreased.

Figure 9A:
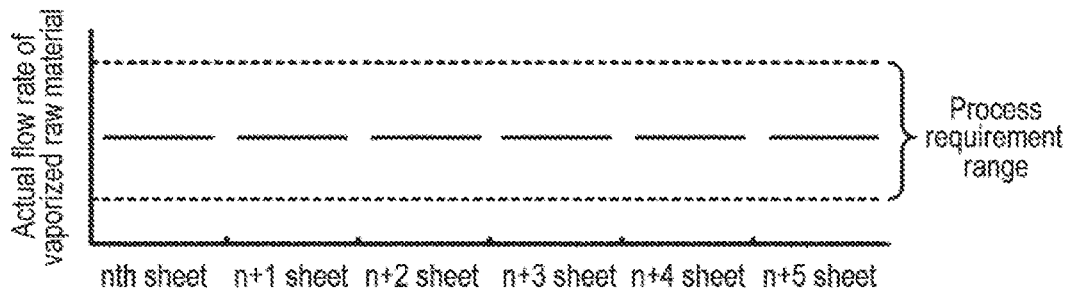
FIGS. 9A to 9C are explanatory diagrams illustrating an actual measurement value of a flow rate of a vaporized raw material when processing each wafer, and a value of a correction factor $K_n$.
Figure 9B:
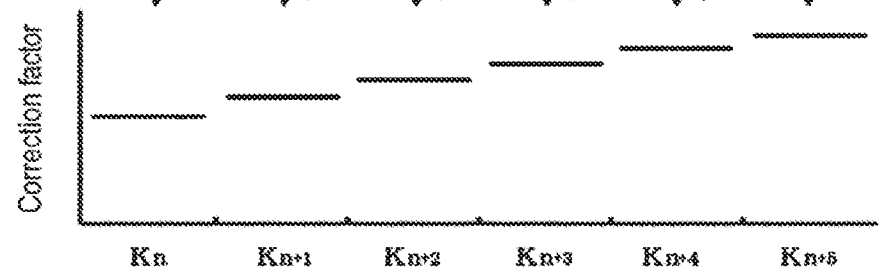
Figure 9C:
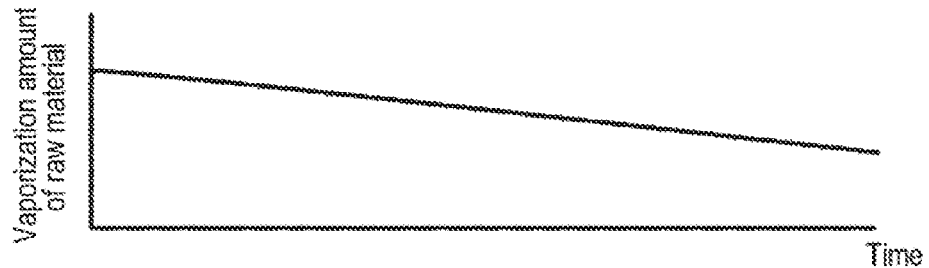

However, in the aforementioned embodiment, the flow rate of the carrier gas is adjusted based on the correction factor $K_n$ indicating the correlation between the actual flow rate of the carrier gas and the actual flow rate of the vaporized raw material in the processing of the immediately-preceding wafer 100. Therefore, as the vaporization amount of the raw material decreases, the correction factor $K_n$ is corrected so as to be larger as illustrated in FIG. 9B. In this manner, as the number of processed wafers 100 increases, the increase/decrease amount of the flow rate of the carrier gas with respect to the increase/decrease amount of the vaporized raw material is corrected so as to be gradually increased. Thus, as illustrated in FIG. 9A, the supply amount of the vaporized raw material in the processing of each wafer 100 becomes a stable value which is close to the target value.

The processing of each wafer 100 is performed in this manner. Even in the last wafer 100, a 25th wafer 100 in this example, the correction factor $K_n$ and the first threshold value and the second threshold value are compared with each other at steps S9 and S10, respectively. If it is determined that the correction factor $K_n$ is lower than the first threshold value and the second threshold value, the process proceeds to step S11. At step S11, since the $25^{th}$ wafer 100 is the last wafer 100, the process is ended.

Figure 10A:
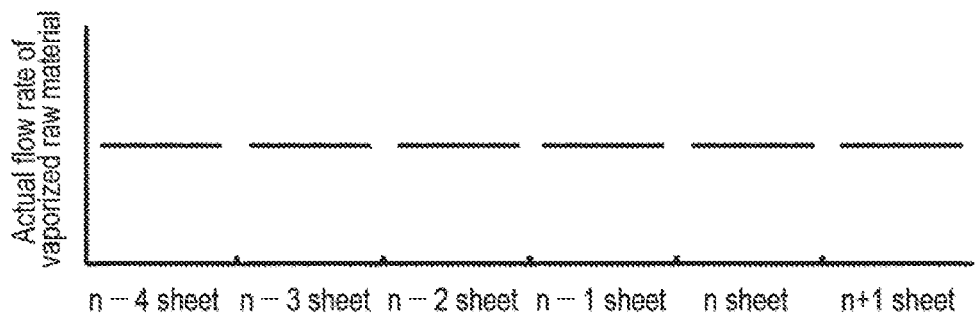
FIGS. 10A to 10C are explanatory diagrams illustrating an operation when a correction factor $K_n$ exceeds a second threshold value.
Figure 10B:
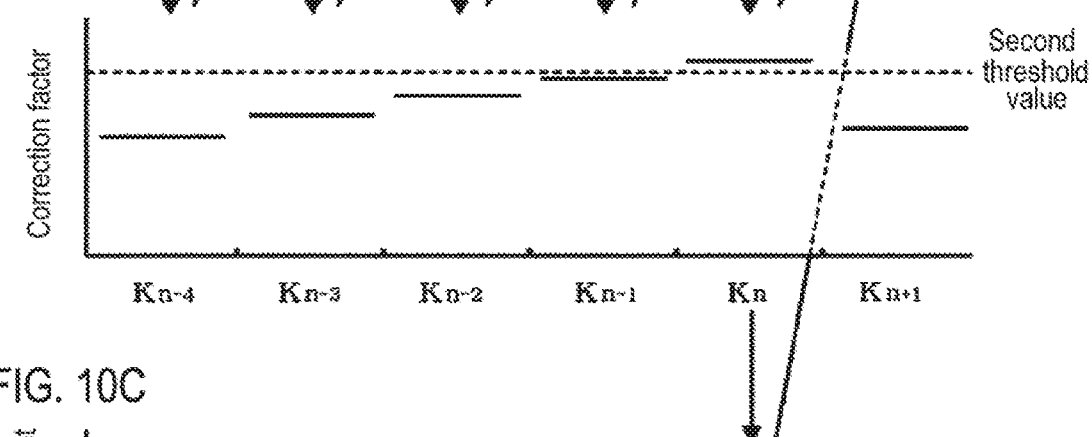

Next, a case where it is determined at steps S9 and S10 illustrated in FIG. 5 that the correction factor $K_n$ exceeds each threshold will be described. First, if it is determined that the acquired correction factor $K_n$ is smaller than the first threshold value and is larger than the second threshold value, the nth wafer 100 is unloaded at step S8 and thereafter the process sequentially proceeds to step S9 and step S10 and in turn goes to step S13. Subsequently, at step S13, the vaporization amount of the raw material is adjusted by adjusting the heating temperature of the raw material container 14. As described above, as the amount of raw material charged in the raw material container 14 decreases, the vaporization amount of the raw material is decreased. Thus, the correction factor $K_n$ is gradually increased as illustrated in a graph of FIG. 10B.

Figure 10C:

Furthermore, for example, assuming that the correction factor $K_n$ calculated in the processing of the nth wafer 100 exceeds, for example, the second threshold value, an increase amount of the temperature of the raw material container 14 is obtained based on a rational equation established by a difference value between the value of the correction factor $K_n$ set at step S7 and a preset correction factor when the vaporization amount of raw material is sufficient (for example, the value of the correction factor $K_A$), a difference value between the correction factors $K_n$ illustrated in FIG. 4, and the increase/decrease amount of the temperature of the raw material container 14. The increase amount of the temperature of the raw material container 14 is inputted to the power feeding part 16 of the raw material container 14. Accordingly, as illustrated in a graph of FIG. 10C, the heating temperature of the heating part 13 of the raw material container 14 is increased so that the vaporization amount of the raw material is increased. Thus, the vaporization amount corresponding to the correction factor $K_A$ is obtained.

Subsequently, in processing an (n+1)th wafer 100, since the vaporization amount of the raw material corresponds to the correction factor $K_A$, a flow rate of the carrier gas is set so that the flow rate of the vaporized raw material becomes equal to the target value for processing. Accordingly, as illustrated in a graph of FIG. 10A, the actual flow rate of the vaporized raw material is stabilized as a value close to the target value. Furthermore, in the processing of the (n+1)th wafer 100, a calculated correction factor $K_{n+1}$ is returned to a value close to the correction factor $K_A$.

Thereafter, the process proceeds to step S11. At step S11, if there is a subsequent wafer 100 to be processed, the process returns to step S3 through step S12, where the processing of the subsequent wafer 100 is continued. Meanwhile, if it is determined at step S11 that the current wafer A is the last one, the process is ended.

If it is determined at step S9 that the correction factor $K_n$ exceeds the first threshold value, that is to say, if the determination result is "YES", the process proceeds to step S14 where an alarm is issued. The process is ended. For example, the maintenance on the raw material gas supply part 10 is performed. For example, in a case where the remaining amount of the raw material container 14 becomes extremely small, even if the temperature of the raw material container 14 is again adjusted in the processing of the nth wafer 100, there may be a case where the vaporization amount of the raw material does not increase as expected. In such a case, in the processing of the (n+1)th wafer 100, the correction factor $K_{n+1}$ exceeding the first threshold value is detected.

According to the aforementioned embodiment, when the processing of the wafer 100 is performed by supplying the vaporized raw material obtained by vaporizing the raw material within the raw material container 14 as the raw material gas together with the carrier gas to the film-forming processing part 40, in the dummy recipe performed before the processing of the wafer 100, the actual flow rates $C_a$ and $C_b$ of the carrier gas and the actual flow rates $Pr_a$ and $Pr_b$ of the vaporized raw material are measured, and the correction factor $K_0$ indicating the correlation between the carrier gas and the vaporized raw material is obtained. Then, the flow rate of the carrier gas is adjusted so as to be equal to the target value using the correction factor $K_0$. Furthermore, in processing an (n−1)th and nth wafers 100, the correction factor $K_n$ indicating the correlation between the increase-decrease amount of the flow rate of the carrier gas and the increase/decrease amount of the flow rate of the vaporized raw material is obtained from the actual flow rates $C_{n-1}$ and $C_n$ of the carrier gas and the actual flow rates $Pr_{n-1}$ and $Pr_n$ of the vaporized raw material. A vaporized raw material whose flow rate is adjusted so as to be equal to the target value is supplied to the (n+1)th wafer 100 using the correction factor $K_n$ for processing of the (n+1)th wafer 100. Thus, the flow rate of the carrier gas is adjusted with an appropriate correction factor according to the vaporization amount of the raw material, which makes it possible to adjust the supply amount of the vaporized raw material.

Furthermore, in the aforementioned embodiment, the correction factor $K_n$ calculated when the amount of raw material remaining in the raw material container 14 is small is set as the first threshold value. When the respective measured correction factor $K_n$ exceeds the first threshold value, an alarm is issued to stop the operation of the device. Thus, it is possible to recognize the timing of replacement of the raw material container 14.

In addition, the correction factor $K_n$ calculated when the vaporization amount of the raw material is decreased even if the remaining amount of the raw material in the raw material container 14 is sufficiently present, is set as the second threshold value. When the respective measured correction factor $K_n$ exceeds the second threshold value, the temperature of the raw material container 14 is adjusted. Therefore, it is possible to increase the vaporization amount of the raw material by recognizing the decrease in the vaporization amount of the raw material and raising the temperature of the raw material container 14.

Furthermore, in the aforementioned embodiment, when the supply and cutoff of the gas in the process recipe is performed 100 cycles, the average values M1, M2 and M3 are calculated using a measurement value obtained at a late stage of the cycles instead of using a measurement value obtained at an initial stage of the cycles. When the supply of the gas starts in the process recipe, the supply amount of the gas tends to be disturbed at the initial stage. Therefore, by calculating the average values M1, M2 and M3 using the measurement value obtained at the late stage, it is possible to acquire a more stable value and to improve the accuracy of the value of the correction factor $K_n$.

Moreover, the present disclosure is not limited to an example in which the correction factor $K_n$ is adjusted for each wafer 100. For example, in an initial operation stage of the film-forming apparatus, the correction factor $K_n$ is likely to vary but the correction factor $K_n$ is stabilized as the number of processed wafers 100 increases. Therefore, after performing the dummy recipe from the idle state of the film-forming apparatus, in the case of processing, for example, 25 wafers 100 of the lot, several sheets (for example, five) of wafers 100 are processed at the initial stage. At this time, the correction factor $K_n$ is acquired each time when the five wafers are processed, thus adjusting the flow rate of the carrier gas.

Subsequently, the correction factor $K_n$ may be rewritten, for example, every time two sheets of wafers 100 are processed. Thereafter, a time interval during which the correction factor $K_n$ is rewritten may be gradually lengthened in such a manner that three sheets of wafers 100, and ultimately four sheets of wafers 100, are processed. Subsequently, the processing of a subsequent wafer 100 is performed by adjusting the flow rate of the carrier gas using a newly-written correction factor $K_n$. In this manner, after the idle state of the film-forming apparatus, the flow rate of the carrier gas is adjusted by calculating the correction factor $K_n$ at shorter intervals using a small number of wafers 100. Thereafter, the number of wafers 100 to be used for calculating the correction factor $K_n$ may be gradually increased. Thus, the time interval during which the correction factor $K_n$ is calculated may be gradually lengthen Furthermore, in the dummy recipe, the first correction factor $K_0$ may be calculated using the actual flow rate C of the carrier gas and the actual flow rate Pr of the vaporized raw material which are calculated when setting the reference correction factor $K_A$ in advance, and the actual flow rate C of the carrier gas and the actual flow rate Pr of the vaporized raw material which are obtained by the dummy process.

In addition, in the aforementioned example, the correction factor is updated in the following method. The (n+1)th wafer 100 is processed by adjusting the set value of the MFC 2 so as to correspond to the difference between the measurement value of the MFM 1 obtained when processing the nth wafer 100 and the target value of the MFM 1. However, the present disclosure is not limited to such a method. As an example, an operation tailored to calculate the correction factor may be periodically performed and a subsequent process may be performed using the correction factor thus calculated. Example of the tailored operation may include a method of obtaining the correction factor $K_n$ by performing the aforementioned dummy process or the process of sequentially setting the set values of the MFCs to two different values and allowing the gas to flow without loading the wafer 100 into the film-forming process part 40 for each setting.

The correction factor $K_n$ may also be a value determined based on the flow rate of the raw material gas and the flow rate of the carrier gas which are calculated by the MFM 1 and MFC 2 in FIG. 1. For example, a value such as (difference value between flow rates of carrier gas/difference value between flow rates of vaporized raw material), (difference value between flow rates of carrier gas/(difference value between flow rates of carrier gas+difference value between flow rates of vaporized raw material)), (difference value between flow rates of vaporized raw material/difference value between flow rates of carrier gas), (difference value between flow rates of vaporized raw material/(difference value between flow rates of carrier gas+difference value between flow rates of vaporized raw material)), or the like may also be applied as the correction factor $K_n$.

In addition, for example, before performing the processing of the lot in the film-forming apparatus or after performing a cleaning process on the interior of the vacuum container 41, a precoating process may be performed in which a film-forming gas is supplied to the vacuum container 41 to deposit a film on an inner surface of the vacuum container 41 and a condition state of the vacuum container 41 is adjusted. In such a precoating process, the measurement of the first correction factor $K_0$ may be performed and subsequently, the processing of the wafer 100 may be performed.

Furthermore, in the aforementioned embodiment, it is assumed at step S9 that the correction factor $K_n$ increases and exceeds the first threshold value when the amount of the raw material decreases. In some embodiments, even when the value of the correction factor $K_n$ is too small, an alarm may be issued. For example, when the heating temperature of the raw material container 14 is too high, or when an abnormality occurs in the MFM 1, the MFC 2 or the MFC 3, it is also assumed that the value of the correction factor $K_n$ becomes too small. Therefore, a third threshold value which is the lower limit value of the correction factor $K_n$ may be additionally set. When the correction factor $K_n$ is lower than the third threshold value, the process proceeds to step S14 where an alarm is issued. Thereafter, the process is stopped and the maintenance may be performed.

Alternatively, a threshold value used for determining that the flow rate of the vaporized raw material is too large may be set. When the vaporization amount of the raw material is too large, the heating temperature of the raw material container 14 may be lowered to reduce the vaporization amount of the raw material.

Furthermore, at step S13, the vaporization amount of the raw material may be increased by adjusting the temperature of the raw material container 14. In this case, the temperature of the raw material container 14 may be gradually raised so as to reach the target temperature when processing a plurality of wafers 100 without increasing it to the target temperature at once at the time of processing a subsequent wafer 100.

For example, it is assumed that the correction factor $K_n$ set when processing the nth wafer 100 exceeds the second threshold value and an increase/decrease value Ta of the target temperature is calculated according to FIG. 4. In this case, the (n+1)th wafer 100 is processed by adding, for example, the increase/decrease value of 50% of Ta to the electric power of the power feeding part 16, an (n+2)th wafer 100 is processed by adding the increase/decrease value of 75% of Ta together with the increase/decrease value of the temperature of the (n+1)th wafer 100, an (n+3)th wafer 100 is processed by adding the increase/decrease value of 88% of Ta together with the increase/decrease value of the temperature of the (n+1)th and (n+2)th wafers 100. In this way, the total increase/decrease value of the temperature is allowed to gradually approach the increase/decrease value Ta. When the increase/decrease value of the temperature is large, the vaporization amount of the raw material may vary at once, making the vaporization amount of the raw material difficult to be stabilized. Therefore, by gradually raising the temperature, the vaporization amount of the raw material is likely to be stabilized and the flow rate of the vaporized raw material supplied to the film-forming processing part 40 is likely to be stabilized.

Furthermore, after raising the temperature of the raw material container 14, the dummy recipe, for example, the second dummy process, may be performed once to calculate the correction factor $K_n$, and subsequently, the processing of a subsequent wafer 100 may be performed.

In addition, the raw material used for the substrate processing is not limited to $WCl_6$ but may be, for example, tungsten pentachloride ($WCl_5$), molybdenum pentachloride ($MoCl_5$), zirconium chloride ($ZrCl_4$, IV), hafnium chloride ($HfCl_4$, IV), aluminum chloride ($AlCl_3$) or the like. Alternatively, the present disclosure may be applied to an apparatus for vaporizing and supplying a liquid raw material. Furthermore, the present disclosure may be applied to a substrate processing apparatus which mixes a raw material gas and a reaction gas and then supplies a mixed gas of them to a substrate.

In another example of the embodiment of the present disclosure, the correction factor $K_n$ may be set using $C_n$ and $Pr_n$ measured for the nth wafer 100.

Figure 5:
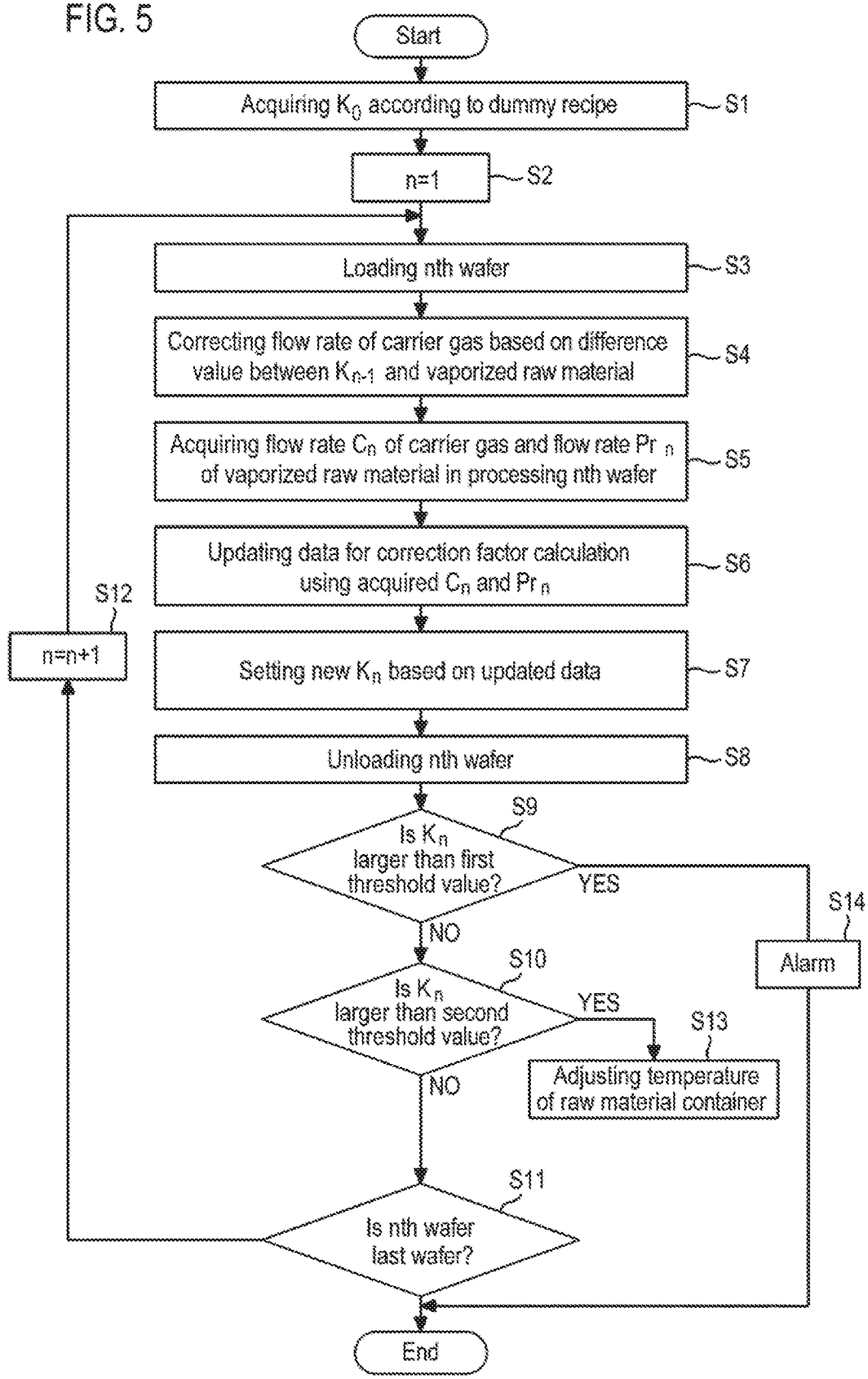
FIG. 5 is a chart diagram illustrating a process of adjusting a supply amount of a vaporized raw material in the substrate processing apparatus.

Furthermore, for example, at step S6 of the flowchart of FIG. 5, the correction factor $K_n$ may be obtained from the following equation (3).

$$\text{Correction factor } K_n = C_n / Pr_n \qquad \text{Eq. (3)}$$

Moreover, in the processing of a subsequent (n+1)th wafer 100, the flow rate of the carrier gas may be calculated from (flow rate of carrier gas=correction factor $K_n \times$target value of flow rate of vaporized raw material). With this configuration, since the correction factor $K_n$ is adjusted when the vaporization amount of the raw material varies, the supply amount of the vaporized raw material can be stabilized. In this example, the correction factor $K_n$ obtained from the flow rate of the carrier gas and the flow rate of the vaporized raw material corresponds to a ratio of the flow rate of the vaporized raw material to the flow rate of the carrier gas. Also, for example, the correction factor $K_n$ may be calculated by using $C_n$ and $Pr_n$ measured on three or more of immediately-preceding wafers 100, for example, by averaging $C_n$ and $Pr_n$ measured on a plurality of wafers 100 respectively.

A flow rate of the mass flow controller that is the basis of the ratio of the flow rate of the vaporized raw material to the flow rate of the carrier gas may be defined as including the measurement value of the actual flow rate by the mass flow controller in addition to the flow rate set value of the mass flow controller.

According to the present disclosure in some embodiments, a plurality of substrates is sequentially processed by supplying a vaporized raw material obtained by vaporizing a raw material inside a raw material container as a raw material gas together with a carrier gas to a substrate processing part. In this case, a first correction factor which is a ratio of a flow rate of the vaporized raw material to a flow rate of the carrier gas is obtained based on a measurement value of a mass flow meter, which is acquired by setting a flow rate set value of a mass flow controller, and the flow rate set value. The substrate is processed by setting the flow rate of the mass flow controller so that the flow rate of the vaporized raw material becomes equal to a target value using the first correction factor. In addition, after the step of obtaining the first correction factor, the carrier gas is supplied to the raw material container, a second correction factor which is a ratio of a flow rate of the vaporized raw material to a flow rate of the carrier gas is obtained based on the flow rate set value of the mass flow controller and the measurement value of the mass flow meter. The substrate is processed by setting the flow rate of the mass flow controller so that the flow rate of the vaporized raw material becomes equal to the target value using the second correction factor. Thus, it is possible to adjust the flow rate of the vaporized raw material based on an appropriate correction factor corresponding to the vaporization amount of the raw material, and to stabilize the supply amount of the raw material.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing each of a plurality of substrates by supplying a carrier gas having a flow rate adjusted by a mass flow controller to a raw material container, and supplying a vaporized raw material obtained by vaporizing a solid or liquid raw material inside the raw material container together with the carrier gas as a raw material gas to a substrate processing part via a raw material gas supply path in which a mass flow meter is installed, the method comprising:

supplying the carrier gas to the raw material container and obtaining a first correction factor based on a first flow rate set value of the mass flow controller and a first measurement value of the mass flow meter, wherein the mass flow controller adjusts the flow rate of the carrier gas to be the first flow rate set value, the first measurement value of the mass flow meter corresponds to a flow rate of the raw material gas containing at least the carrier gas and the vaporized raw material, and the first correction factor is a ratio of a flow rate of the vaporized raw material to the flow rate of the carrier gas;

adjusting the first flow rate set value of the mass flow controller according to the first correction factor so that the flow rate of the vaporized raw material becomes equal to a target value to process the substrate;

after the step of obtaining the first correction factor, supplying the carrier gas to the raw material container and obtaining a second correction factor based on a second flow rate set value of the mass flow controller and a second measurement value of the mass flow meter, wherein the mass flow controller adjusts the flow rate of the carrier gas to be the second flow rate set value, the second measurement value of the mass flow meter corresponds to the flow rate of the raw material gas containing at least the carrier gas and the vaporized raw material, and the second correction factor is a ratio of the flow rate of the vaporized raw material to the flow rate of the carrier gas; and adjusting the second flow rate set value of the mass flow controller according to the second correction factor so that the flow rate of the vaporized raw material becomes equal to the target value to process the substrate.

2. The method of claim 1, wherein the ratio of the flow rate of the vaporized raw material to the flow rate of the carrier gas is a ratio indicating a correlation between an increase/decrease amount of the flow rate of the carrier gas and an increase/decrease amount of the flow rate of the vaporized raw material, which is obtained based on the first and second measurement values of the mass flow meter acquired in a state where the first and second flow rate set values of the mass flow controller are set to different values, and the first and second flow rate set values.

3. The method of claim 2, wherein the step of obtaining the first correction factor and the step of obtaining the second correction factor are respectively performed based on the first and second flow rate set values of the mass flow controller and the first and second measurement values of the mass flow meter, which are obtained when processing preceding and following substrates among the plurality of substrates, and the step of adjusting the second flow rate set value of the mass flow controller according to the second correction factor includes processing a subsequent substrate subsequent to the preceding and subsequent substrates.

4. The method of claim 1, wherein the ratio of the flow rate of the vaporized raw material to the flow rate of the carrier gas is a ratio indicating a correlation between the flow rate of the carrier gas and the flow rate of the vaporized raw material.

5. The method of claim 4, wherein the step of obtaining the first correction factor and the step of obtaining the second correction factor are respectively performed based on the first and second flow rate set values of the mass flow controller and the first and second measurement values of the mass flow meter when processing the substrate.

6. The method of claim 1, further comprising: after the step of obtaining the second correction factor, obtaining a third correction factor based on a third flow rate set value of the mass flow controller and a third measurement value of the mass flow meter by supplying the carrier gas to the raw material container, the third correction factor being a ratio of the flow rate of the vaporized raw material to the flow rate of the carrier gas; and adjusting the third flow rate set value of the mass flow controller according to the third correction factor so that the flow rate of the vaporized raw material becomes equal to the target value to process the substrate, and wherein the number of substrates processed between the step of obtaining the second correction factor and the step of obtaining the third correction factor is larger than the number of substrates processed between the step of obtaining the first correction factor and the step of obtaining the second correction factor.

7. The method of claim 1, further comprising:

comparing the first correction factor or the second correction factor with a first allowable range; and detecting whether a remaining amount of the raw material in the raw material container is insufficient based on the comparison result.

8. The method of claim 1, further comprising:

comparing the first correction factor or the second correction factor with a second allowable range;

detecting whether the vaporization amount of the raw material is excess or insufficient based on the comparison result; and when the first correction factor or the second correction factor is out of the second allowable range, adjusting a heating temperature of the raw material so that the flow rate of the vaporized raw material with respect to the flow rate of the carrier gas measured when processing an immediately-preceding substrate becomes equal to the target value, based on a relationship between an increase/decrease amount of the correction factor and a variation of the heating temperature of the raw material, and a set correction factor.

9. A non-transitory computer-readable storage medium storing a computer program for use in a substrate processing apparatus which processes each of a plurality of substrates by supplying a carrier gas having a flow rate adjusted by a mass flow controller to a raw material container and supplying a vaporized raw material obtained by vaporizing a solid or liquid raw material in the raw material container together with the carrier gas to a substrate processing part via a raw material gas supply path in which a mass flow meter is installed, wherein the computer program includes a group of steps for executing the method of claim 1.

* * * * *